United States Patent [19]

Shea et al.

[11] 4,131,363

[45] Dec. 26, 1978

[54] PELLICLE COVER FOR PROJECTION PRINTING SYSTEM

[75] Inventors: Vincent Shea; Walter J. Wojcik, both of Poughkeepsie, N.Y.

[73] Assignee: International Business Machines Corporation, Armonk, N.Y.

[21] Appl. No.: 857,632

[22] Filed: Dec. 5, 1977

[51] Int. Cl.² ............................................. G03B 27/62
[52] U.S. Cl. ........................................ 355/75; 355/53
[58] Field of Search ...................... 355/75, 30, 18, 53, 355/54, 77, 67

[56] References Cited

U.S. PATENT DOCUMENTS

| 3,824,014 | 7/1974 | Abita | 355/75 |
| 4,063,812 | 12/1977 | Abraham et al. | 355/18 |

FOREIGN PATENT DOCUMENTS 267906  1/1969  Austria ...................................... 355/75

OTHER PUBLICATIONS

IBM Technical Disclosure Bulletin, vol. 18, No. 10, Mar. 1976, pp. 3360-3361, "Package Mask for Photolithography".
IBM Technical Disclosure Bulletin, vol. 15, No. 10, Mar. 1973, p. 3012, "Fixed Gap for Proximity Printing".
IBM Technical Disclosure Bulletin, vol. 17, No. 8, Jan. 1975, p. 2267, "Integrated Circuit Fabrication Involving Projection Exposure of Photoresist".

*Primary Examiner*—Richard A. Wintercorn
*Attorney, Agent, or Firm*—David M. Bunnell

[57] ABSTRACT

In a projection printing system the pattern mask, whose image is projected onto a light sensitive layer, is protected with a thin, 0.2-6 micron thick, transparent film or pellicle which is positioned an optically large distance of about 1-125 mm from the mask surface by a spacer member. Any dirt particles on the surface of the pellicle will be out of focus and are not printed in the light sensitive layer. A pellicle can also be employed to protect the light sensitive layer at the image plane.

5 Claims, 5 Drawing Figures

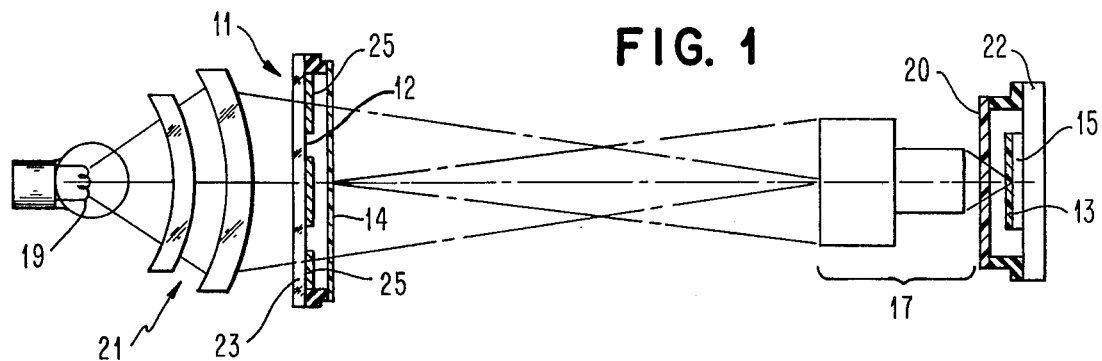
FIG. 1
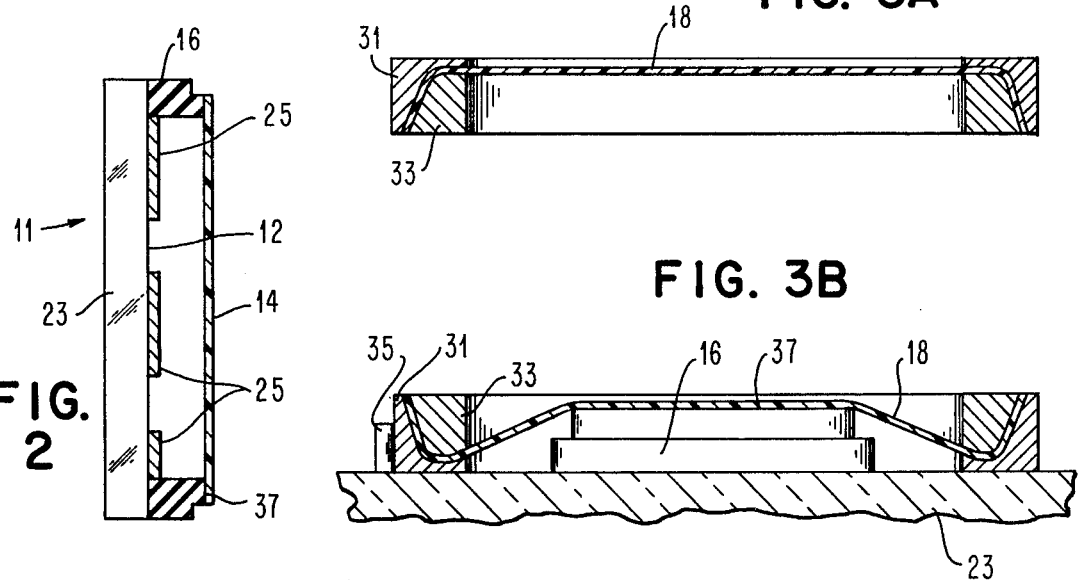
FIG. 3A
FIG. 3B
FIG. 2
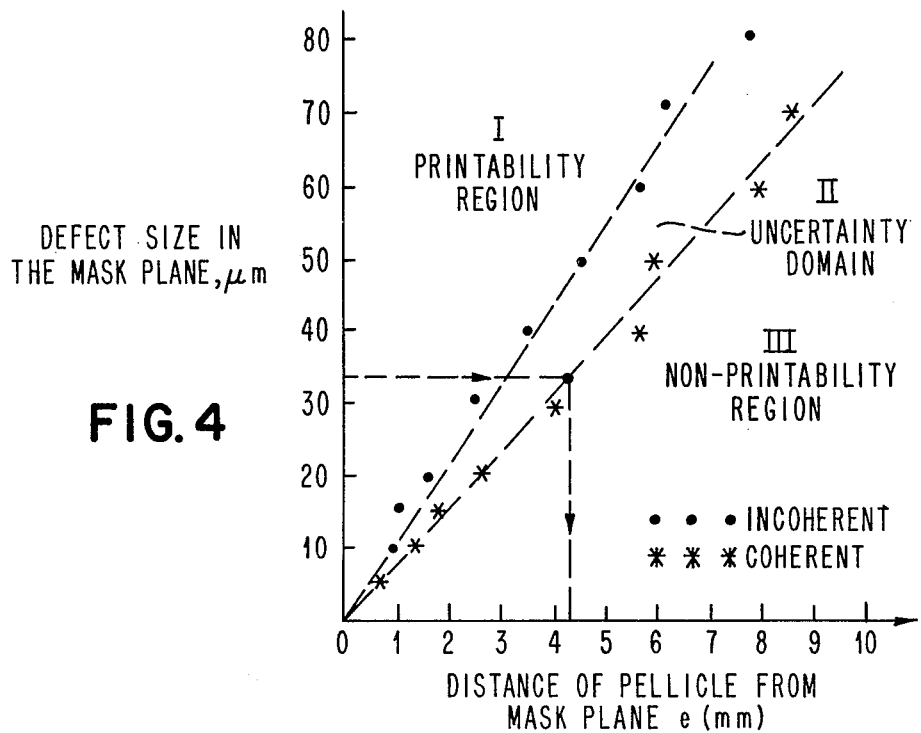
FIG. 4

PELLICLE COVER FOR PROJECTION PRINTING SYSTEM

BACKGROUND OF THE INVENTION

This invention relates generally to projection printing and more specifically to a projection printing system having a pattern mask structure which avoids the printing of contamination particles.

In the manufacture of integrated circuits, the various devices and circuit connections are formed using photoresist masks to protect the semiconductor substrate except in the areas where processing, such as etching or metal deposition, is desired to occur.

The photoresist masks are formed by coating the substrate with a layer of resist and then patternwise exposing the resist by passing ultraviolet light through the apertures of a pattern mask. The light causes the resist layer in the light struck areas to either harden, in the case of a negative resist, or to degrade, in the case of a positive resist. The unhardened or degraded areas are then removed by a developer to expose portions of the substrate for processing. The pattern masks are usually formed of a transparent substrate with a pattern of opaque areas of, for example, silver or chromium formed on one surface.

In the past, three types of resist printing have been used. The most common method is contact printing in which the patterned surface of the mask is pressed into contact with the resist layer. This has the disadvantage of limited mask life due to dirt pickup and physical damage to the mask resulting from the contact between the mask and substrate. The image size is also limited to a 1 to 1 reproduction. Proximity printing has been used to reduce contact damage. The image size is still limited to a 1 to 1 reproduction and a new problem is introduced by the out of contact exposure because of light diffraction effects which can reduce resolution and cause ghost images. More recently, projection printing using high quality optics has been employed. The separation of mask and substrate not only prolongs mask life, as in the case of proximity printing, but provides the ability to form not only 1 to 1 reproductions but reduced size images on the substrate. The mask image can then be, for example, 2 to 10 times the size of the image formed on the substrate. This makes the formation and checking of suitable masks easier because the images are larger. It also has the advantage that errors in the mask are reduced in size in the image formed on the substrate so that mask errors which would be harmful in a 1 to 1 magnification ratio system can be ignored. One disadvantage which has been found with projection printing is its sensitivity to particles of contamination which collect on the transparent areas of the patterned surface of the mask. Because the system is designed to bring the mask pattern image into sharp focus on the photoresist layer surface, the contamination particles are also brought into sharp focus with optimum resolution and contrast at the substrate plane so that the images of the larger particles are printed in the resist layer. This problem is compounded with systems which reduce the size of the image because of the much larger relative size of the mask area. This greatly increases the probability of contamination particles of a size large enough to print being located on a transparent area of the mask pattern even in a clean room environment.

Copending application Ser. No. 713,948 filed Aug. 12, 1976 entitled "Projection Printing System With An Improved Mask Configuration", now U.S. Pat. No. 4,063,812, discloses a solution to the dirt problem by encasing a mask in a glass sandwich so that any dirt particles on the surfaces of the sandwich are out of focus and are not printed.

We have now found an improved structure for the avoiding of the printing of dirt particles which is easy to construct and which has a minimal effect on the optical path of the projection printing system so that little if any adjustment is needed of the mask or image planes even with large separations between the mask pattern and the surface of the cover.

BRIEF SUMMARY OF THE INVENTION

In accordance with the invention there is provided a projection printing mask comprising a pattern of opaque and transparent areas formed on a transparent substrate and a cover bonded to the substrate said cover including a pellicle which is a transparent, about 0.2–6 microns thick, film which is spaced from about 1 to 125 millimeters from the pattern such that the pattern is protected against damage and dirt and the images of any dirt particles on the outer surface of the pellicle are maintained out of focus so that the images will not be printed when the pattern is printed on a light sensitive substrate.

Also provided is a projection printing system for forming an image on a light sensitive substrate which system includes a mask having a transparent substrate with a pattern of opaque and transparent areas formed on one surface thereof, an illuminating system for directing light through the mask to the light sensitive substrate, optical means for forming a focussed image of the mask pattern on the light sensitive substrate and a pellicle cover for maintaining the images of any dirt particles on the surface of the mask out of focus. The pellicle cover is bonded to the substrate and completely covers the mask pattern. The pellicle is a thin transparent film which is spaced from about 1 to 125 millimeters from the pattern, and has a thickness of about 0.2–6 microns such that the cover does not substantially effect the optical path length of the system. In a further improvement a pellicle cover is used at the image plane to protect the light sensitive substrate from contamination.

DESCRIPTION OF THE DRAWINGS

FIG. 1 is a schematic diagram of an optical projection printing system illustrating an embodiment of the invention.

FIG. 2 is a schematic edge view of a pattern mask with a pellicle cover.

FIGS. 3A and 3B are schematic views illustrating the preparation of a pellicle cover.

FIG. 4 is a graph illustrating the distance of the pellicle from the mask pattern which is required to avoid printing contamination particles of a given size.

DETAILED DESCRIPTION

FIG. 1 illustrates a projection printing system in which a reduced image of a pattern mask 11 is formed on a photoresist layer 13 on substrate 15 by means of a focussing optical system 17 which is, for purposes of illustration, a refracting projection lens. It should be understood that the system of the invention could also have a 1 to 1 magnification ratio and could employ other focussing optical systems which employ mirrors or a combination of refractive and reflective elements. A source 19 of illumination is provided, for example a mercury lamp, with suitable filters and shutters (not shown) and a condenser 21. Mask 11 is conventionally made of a transparent support 23, such as borosilicate glass or quartz with opaque areas 25 of, for example, chromium or silver formed on surface 12 to provide a pattern of adjacent areas of ideally 0 or 100 percent transmission of light from source 19. The dimensions of the individual areas or features of the pattern for a mask used in integrated circuit manufacture are in the range of about 1 to 100 microns. In accordance with the invention, mask 11 is provided with a cover 14 as further illustrated in FIG. 2.

The mask 11 can be constructed from a square borosilicate glass substrate 23 with a pattern of opaque areas of chromium on surface 12. Cover 14 has a spacer ring 16 which is bonded to surface 12. A thin transparent film or pellicle 18 is stretched over and bonded to mounting ring 37. Pellicle 18 should be transparent and have a thickness of about 0.2 to 6 microns such that it does not substantially affect the optical path of the projection system. Such thicknesses will only result in a 0.67-2 micron shift in the object. This avoids the need to compensate for the presence of the cover such as by adjusting the mask or image plane. It also permits an unlimited separation between the mask as no aberrations are introduced with the thin film. This is an advantage over the use of a glass sandwich when a larger separation is desirable with high magnification systems (10 to 20 × for example) or where clean room conditions are less stringent. Suitable pellicle materials are for example polymer films such as polyoxyethylene terephthalate, sold under the tradename Mylar, nitrocellulose, and parylene. Antirereflective coatings can be employed on the film to further reduce any effects on the projection system.

The cover can be made as illustrated in FIGS. 3A and 3B. A pellicle 18 of 2.5 micron thick Mylar membrane is locked between two rings 31 and 33. The locked rings are then placed with the aid of guide pin 35 so that pellicle 18 is stretched over mounting ring 37. The pellicle is bonded to the ring with an adhesive and the excess film around the edge of ring 37 is removed. This method provides the ability to form covers where the radial tension from ring to ring is nearly constant.

The distance that the pellicle is spaced from the mask pattern is varied depending upon the size of the dirt particles which are expected in the environment. The thickness which is needed to defocus particles of a given size will depend upon the numerical aperture of the projection system. The plots in FIG. 4 illustrate the particle sizes which are defocussed for a given distance for a given distance for a projection system having a numerical aperture of 0.05 on the mask side. For example, in region I, all points in this region correspond to defects which will be printed. In region III, all points in this region correspond to defects which will not be printed. In domain II, all points in this region correspond to defects the printability of which depends on the transparency of the particle and the coherence of the projection system. As an example of a choice of distance, given an expected particle size of about 35 microns as contamination, the plot shows that the minimum plate thickness necessary for 35 micron particles not to be printed is about 4.4 millimeters. In a typical projection printing system environment it would be reasonable to expect dirt particles in the size and range of up to a maximum of about 50 microns representing the size of a skin flakes. A distance of about ¼ inch (6mm) would prevent the printing of such particles with a margin for safety.

The plots in FIG. 4 have been established for a contrast loss of 90%. If a different contrast loss is considered the plots would be reconstructed. The plots are also based on a projection system of a given numerical aperture. Systems having differing numerical apertures would require distances somewhat differing from the above plots of FIG. 4 to assure the non-printability of contamination particles of any given size. Some references concerning the calculation of contrast loss in optical systems due to aberrations (i.e., defocussing) are listed below:

W. H. Steel, Revue d'Optique, Volume 31, 1972, p. 334, Volume 32, 1953, p. 4; W. H. Steel, Optica Acta, Volume 3, 1956, p. 65, H. H. Hopkins, Proceedings of the Royal Society A, Volume 231, 1955, p. 91; B, Volume 55, 1943, p. 116, Volume 69, 1956, p. 562, Volume 70, 1956, pps. 449, 1002, and 1162; A. Marechal, Diffraction — Structure des Images — 1970 Editor Masson & Cie, Paris.

From the plots in FIG. 4 it can be seen that a plate thickness of about 6 millimeters or ¼ inch is sufficient to prevent the printing of the largest particle size which should be anticipated in a normal clean room environment used in photolithography. A practical range of distances, which the pellicle should be spaced from the plane of the mask pattern of opaque and transparent areas, for projection systems including high magnification step and repeat systems (10 × and 20 × for example), taking into account the normal clean room environment, would be from about 1 to 125 millimeters.

Besides protecting the mask plane, a similar pellicle cover can also be used at the image plane to protect the light sensitive substrate as illustrated by pellicle cover 20 on chuck 22 over substrate 15 in FIG. 1. This will avoid contamination particles from reaching, and masking out portions of the light sensitive layer which should be exposed. The cover 20 could also be attached to the wafer.

While the invention has been particularly described with respect to preferred embodiments thereof it should be understood by one skilled in the art that the foregoing and other changes in form and details may be made therein without departing from the spirit and scope of the invention.

We claim:

1. A projection printing mask comprising a pattern of opaque and transparent areas formed on a transparent substrate and a cover bonded to the substrate said cover including a pellicle which is a transparent film having a thickness of from about 0.2 to 6 microns which is spaced from about 1 to 125 millimeters from the pattern such that the pattern is protected against damage and dirt and the images of any dirt particles on the outer surface of the pellicle are maintained out of focus so that the images will not be printed when the pattern is printed on a light sensitive substrate.

2. A projection printing system for forming an image on a light sensitive substrate said system comprising a mask having a transparent substrate with a pattern of opaque and transparent areas formed on one surface thereof, an illuminating system for directing light through the mask to the light sensitive substrate, optical means for forming a focussed image of the pattern on the light sensitive substrate and a pellicle cover means for maintaining the images of any dirt particles on the mask out of focus so that the images will not be printed on the light sensitive substrate, said pellicle cover means being bonded to the transparent substrate and completely covering the pattern and including a pellicle which is a thin transparent film having a thickness of about 0.2 to 6 microns and being spaced from about 1 to 125 millimeters from the pattern such that the cover means does not substantially effect the optical path length of the system.

3. The projection printing system of claim 2 wherein a second pellicle cover is located at the image plane so as to protect the light sensitive substrate from contamination.

4. The mask of claim 1 wherein the dimensions of the individual area of the pattern are in the range of about 1 to 100 microns.

5. The mask of claim 2 wherein the dimensions of the individual areas of the pattern are in the range of about 1 to 100 microns.

* * * * *